(12) United States Patent
Gear et al.

(10) Patent No.: US 6,625,607 B1
(45) Date of Patent: Sep. 23, 2003

(54) METHOD OF COMPARING PARTS

(75) Inventors: Paul J. Gear, Apopka, FL (US); Bradley J. Visser, Longwood, FL (US)

(73) Assignee: Parametric Technology Corporation, Needham, MA (US)

( * ) Notice: Subject to any disclaimer, the term of this patent is extended or adjusted under 35 U.S.C. 154(b) by 0 days.

(21) Appl. No.: 09/575,317

(22) Filed: May 19, 2000

Related U.S. Application Data

(60) Provisional application No. 60/185,834, filed on Feb. 29, 2000, and provisional application No. 60/145,160, filed on Jul. 22, 1999.

(51) Int. Cl.[7] .............................. G06F 17/00; G06F 7/00
(52) U.S. Cl. .............................. 707/101; 707/102; 707/3
(58) Field of Search .................. 707/1, 3, 10, 101–102; 700/97–98, 117, 118; 703/1; 345/964, 420, 428; 382/141

(56) References Cited

U.S. PATENT DOCUMENTS

| | | | | |
|---|---|---|---|---|
| 4,748,676 A | * | 5/1988 | Miyagawa et al. | 382/206 |
| 4,821,214 A | * | 4/1989 | Sederberg | 345/420 |
| 5,339,247 A | * | 8/1994 | Kirihara et al. | 700/106 |
| 5,442,572 A | | 8/1995 | Kiridena et al. | 382/141 |
| 5,848,115 A | | 12/1998 | Little et al. | 378/4 |
| 5,978,502 A | * | 11/1999 | Ohashi | 348/126 |
| 6,032,151 A | * | 2/2000 | Arnold et al. | 707/102 |
| 6,098,025 A | * | 8/2000 | Bae | 702/94 |
| 6,128,020 A | * | 10/2000 | Arimatsu et al. | 345/420 |
| 6,224,249 B1 | * | 5/2001 | Ozawa et al. | 700/161 |
| 6,337,685 B2 | * | 1/2002 | Nagakura | 345/419 |
| 6,366,824 B1 | * | 4/2002 | Nair et al. | 700/110 |

FOREIGN PATENT DOCUMENTS

| | | | |
|---|---|---|---|
| EP | 447629 A2 | * 9/1991 | G06F/15/72 |
| GB | 2155172 | 9/1985 | |
| GB | 2156564 | 10/1985 | |
| GB | 2246230 | 1/1992 | |
| GB | 2311154 | 9/1997 | |
| GB | 2349493 | 11/2000 | |
| GB | 2352076 | 1/2001 | |

OTHER PUBLICATIONS

Grey, Nigel "Actionstations" , 1993, Cadam,v12,No. 10, p. 24(3).*

* cited by examiner

*Primary Examiner*—Greta Robinson
*Assistant Examiner*—Susan Rayyan
(74) *Attorney, Agent, or Firm*—David G. Maire; Beusse Brownlee Bowdoin & Wolter, P.A.

(57) ABSTRACT

A method of comparing parts by comparing metadata representing the part topologies to identify identical or near identical parts. Metadata representing the geometry of a plurality of parts is compiled into a database. Corresponding metadata of a subject part may be determined and compared to the metadata stored in the database. The metadata may include values representing the volume, surface area, and principal moments of inertia of the parts. The metadata may additionally contain values representing the location of the cross-sectional center of gravity with respect to the point of intersection of the principal moments, for each of the planes of the principal moments, thereby allowing mirrored parts to be differentiated. The comparison of complex parts may be performed by comparing as few as five metadata values using simple database management tools.

16 Claims, 1 Drawing Sheet

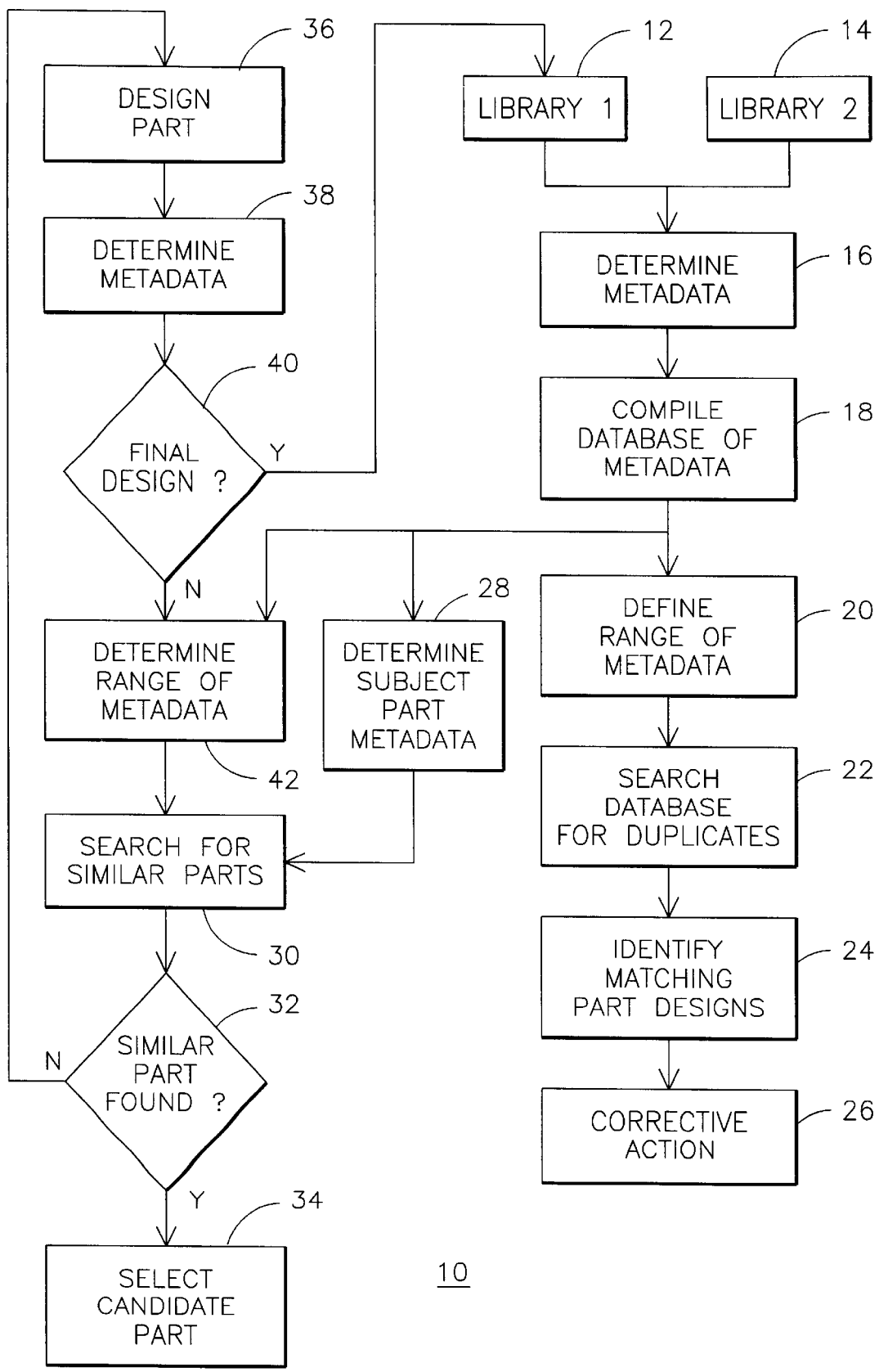

METHOD OF COMPARING PARTS

This application claims the benefit of the Jul. 22, 1999, filing date of U.S. provisional patent application No. 60/145, 160, as well as the Feb. 29, 2000, filing date of U.S. provisional patent application No. 60/185,834.

BACKGROUND OF THE INVENTION

The process of designing a mechanical part has been changed significantly by the widespread use and tremendous capability of computer aided drafting and computer aided design (CAD) tools. As the speed of computing power has increased and the attendant cost has decreased, the volume and type of design work performed with the assistance of a computer has expanded dramatically. In almost every industry the computer has become the design engineer's tool of choice for crafting everything from the most simple of designs to completely integrated systems. Current technology provides for the computerized integration of the entire product lifecycle, including design, simulation, manufacturing, service and retirement. Descriptions of state-of-the-art computer aided design tools can be found by visiting the Internet home page of the assignee of the present invention at www.ptc.com.

The simplicity of generating, saving and retrieving digital models of parts has resulted in an explosion in the number of part designs that are stored in the computers of engineering firms, industrial corporations and CAD product and service providers. For example, the Inpart$^{SM}$ database of the assignee of the present invention includes over a million three-dimensional part models as of the filing date of this invention. Such inventories of existing designs can prove very useful to a designer who has the ability to extract an existing design for use on a new project. Unfortunately, the industry's ability to extract a useful design has not kept pace with its ability to create and to save such designs. In some cases, the designer may know of an existing part model or its identification code and is able to open the associated data file on a CAD tool. The Inpart$^{SM}$ service offered by the assignee of this invention allows a user to browse through a directory structure to identify a category of parts similar to that desired by the user. For example, a user wishing to find a design for a waterproof 9-pin electrical connector can follow a series of branching decisions leading from electrical parts generally, to electrical connectors, to waterproof connectors, to 9-pin connectors. The system will then present a listing of part designs contained in that branch of the directory. While this type of searching tool has proven very useful, it is limited by the level of detail into which the various part models are categorized in the predefined directory structure.

Existing CAD systems have the capability of very accurately comparing two known part models, or of comparing a part model with inspection data from a manufactured part. U.S. Pat. No. 5,442,572 dated Aug. 15, 1995, and U.S. Pat. No. 5,848,115 dated Dec. 8, 1998, both incorporated by reference-herein, describe known methods for the comparison of an actual part geometry to a predetermined geometry. These methods involve the comparison of parts on a point by point basis. Furthermore, the Pro/VERIFY™ program sold by the present assignee utilizes a technique for matching clouds of points in order to compare automated inspection data to a solid part model. This capability is very helpful in a manufacturing or quality control application, however, it is of limited usefulness to a user searching for a particular part design, since the specific model to be used in the comparison must be identified by the user, and the associated data file must be opened by the CAD tool.

When designing new products, the manufacturing industry often re-uses existing designs or portions of existing designs. As new computerized part models are created, there is a potential for the same part or a similar part to be duplicated across several products and product lines. This duplication generates cost as a result of the duplication of part numbers and drawings, the loss of volume discounts resulting from the unknowing use of multiple vendors, and the maintenance of duplicated inventory volumes. The more new parts that are created, the greater the potential for the unnecessary duplication of part designs.

SUMMARY OF THE INVENTION

Thus there is a particular need for a rapid method of comparing parts. Such a method should permit a user to rapidly search for a matching or similar part design stored in any collection of model data containing a large number of existing part designs.

Accordingly, a method of comparing parts is disclosed herein, the method comprising the steps of: compiling a database representing a plurality of parts, each part represented uniquely in the database by metadata representing the geometry of the part; determining corresponding metadata representing the geometry of a subject part; and identifying a range of values associated with the metadata of the subject part; and searching the database to identify all ones of the plurality of parts having metadata within the range of values. The metadata utilized in this method may include values representing the volume, surface area, and the principal moments of inertia of a part. The metadata may also include values representing the location of the cross-sectional center of gravity with respect to the point of intersection of the principal moments, for each of the planes of the principal moments.

A further method of comparing parts is disclosed herein, the method comprising the steps of: compiling a database representing a plurality of parts, each part represented in the database by values representing the volume, surface area, and principal moments of inertia of the part; determining values representing the volume, surface area and principal moments of inertia of a subject part; identifying a range of values associated with each of the volume, surface area, and principal moments of inertia of the subject part; and searching the database to identify all ones of the plurality of parts having values representing volume, surface area, and principal moments of inertia within each of the respective ranges of values.

BRIEF DESCRIPTION OF THE DRAWINGS

The drawing illustrates the steps in a method for comparing parts and for identifying duplicate parts among a plurality of part designs.

DETAILED DESCRIPTION OF THE INVENTION

The FIGURE illustrates a method 10 for comparing parts. The word "part" as used herein is meant to include not only discrete pieces but also logical groupings of individual pieces. A plurality of solid part models may be stored in one or more libraries, such as Library 1 and Library 2 as illustrated in steps 12, 14 respectively. These libraries may typically be digital data stored on an appropriate medium, such as the data disk of a computer, optical disk, tape, etc.

The software tool(s) utilized to model these parts and to create the two separate data libraries may be significantly different. Therefore the data stored at step 12 may have a significantly different format than the data stored at step 14. A single part modeled in both of these heterogeneous environments will be represented by different data content and format in each of their respective libraries. Furthermore, a single part modeled in a single environment may also be represented by somewhat different data. This can occur due to the methodology utilized to create the model, such as differences in programmed features such as chamfers, dimensional rounding, and the order of the development of the structure.

For each of the models contained in Libraries 1 and 2 in steps 12, 14, it is possible to determine certain metadata representing the geometry of the respective parts. The term "metadata" is used herein to mean one or more numeric values associated with and representative of a physical feature of a particular solid model. In one embodiment, a value is calculated for the volume, the surface area, and each of the three principal moments of inertia of each part. These five values are the metadata representing that part for this embodiment. The metadata for each of the plurality of parts of Libraries 1 and 2 may be compiled into a database of metadata at step 18. The term "database" is used herein to broadly describe a searchable collection of data, and may include, for example, flat files, web site, etc. The database may then be searched at step 22 to identify parts having the same or very similar metadata. Such a search may be performed by any technique known in the art, including off-the-shelf database management tools, since it is a simple comparison of five pairs of individual numerical values. The applicants have found that by using metadata containing values representing the volume, surface area, and principal moments of inertia, it is possible to uniquely distinguish most parts. By searching the database for identical metadata, duplicate parts may be identified without utilizing the time consuming and computationally intensive methods of the prior art and without the need to open the full data file representing the part model. Also, because the metadata values represent the geometry of the part, they are independent of the format of the CAD model data, so parts of Library 1 may conveniently be compared to parts of Library 2 so long as the same metadata is used. Parts having substantially the same geometry, yet not being identical, may be further identified in step 22 by first defining a range of metadata that is representative of an acceptable range of mismatch, such as at step 20. For example, if the metadata contains values representing the volume of a part, a range of volumes may be identified in step 20 as being the nominal volume plus or minus a predetermined percentage, such as for example, plus or minus one percent. Ranges having an equal or varying degrees of mismatch may be identified for each of the values contained in the metadata. A search conducted in step 22 may then be used to search for parts having metadata within the range of mismatch values. Parts satisfying the search criteria, whether it be an exact match or a range of values, are then identified in step 24 as an output of the database search of step 22. Once such identical or very similar parts have been identified, an appropriate action may be taken at step 26. Such action may include, for example, the elimination of redundant part models within the various part libraries.

In addition to identifying duplicate parts within a library of part models, the method 10 of the present invention may also be utilized to search for parts having a design the same as or similar to a subject part. Once a database or file has been compiled containing the metadata representing a plurality of part models, as in step 18, the corresponding metadata may be determined for a subject part at step 28. A search may then be conducted at step 30 to identify parts within the database having metadata that is identical to or within a predetermined range of the metadata of the subject part, such as at step 30. One or more sufficiently similar parts may be identified at step 32, thereby allowing the operator to select an appropriate candidate part at step 34 for further operations. This method may be utilized by a designer desiring to use one of a plurality of part models already existing in a database. The designer may first produce a very rough version of a part design at step 36 using a computer aided design tool. The appropriate metadata may then be determined for this rough design at step 38. This rough design is found not to be adequate as a final design at step 40, so a search may be conducted for sufficiently similar parts at step 30 using a range of metadata defined in step 42. If a part in the database compiled at step 18 is found to be sufficiently similar at step 32, that part may then be utilized by the designer at step 34. If however, no sufficiently similar part is found at step 32, the designer may proceed to perform further design refinements on the subject part at step 36, thus creating a revised model for the subject part. At appropriate points along the design process, metadata may be determined for the subject part at its current state of design at step 36. The calculation of appropriate metadata at step 38 may be a function initiated by the designer, or it may be an automatic function performed by the CAD tool periodically as the design of the part progresses. The design may progress and be continually compared to existing part models by the reiteration of steps 36,38,42,30,32. Once it is determined that the design is complete at step 40, the resulting part model may be stored in an appropriate library such as at step 12. As the design is refined, the designer may find that the metadata of the part being designed comes within the predetermined range of metadata of one or more existing part designs. By periodically comparing the metadata of the part being designed to the database of metadata for existing parts, such as at step 30, the designer may be alerted in step 32 when the subject part design approaches that of an existing design. This periodic comparison may be automated within the design tool functionality. Once an appropriate candidate part is identified at step 34, the designer may elect to discontinue the part design in favor of using an existing part from the database.

The values selected as metadata to represent a part in step 16, 38 should be chosen to uniquely define a part within a plurality of parts stored in a library 12, 14. As discussed above, values representing the volume, surface area and principal moments of inertia of the part have proven to be useful as metadata for most situations. However, these five values alone are incapable of differentiating mirror image parts. To effectively differentiate between two mirror image parts, additional values representing physical characteristics of the part geometry must be utilized. The inventors have found that mirror image parts can be uniquely identified by using not only the volume, surface area and principal moments of inertia of the parts, but by also comparing values representing the location of the cross-sectional center of gravity with respect to the point of intersection of the principal moments, for each of the planes of the principal moments. By comparing the arithmetic signs of the values representing this location of the cross-sectional centers of gravity of a subject part with the equivalent arithmetic signs of the values representing the location of the cross-sectional center of gravity for a second part, mirror image parts will be identified as having at least one sign change in these values. Since the values representing the location of the cross-sectional center of gravity with respect to the point of intersection for each of the planes of the principal moments requires only two values, such as (X,Y), it may be appreciated that this further step of identifying mirror image parts requires the calculation and comparison of only six additional values for the metadata for each part. For identical parts, all eleven values will be the same for each part. For mirror image parts, ten or fewer of the eleven values will be the same, and the remaining values will have the same magnitude but the arithmetic sign will be opposite (plus/minus) for the two parts.

It may be appreciated that the method of the subject invention provides a novel and useful tool for the comparison of very complex part models by using relatively straight-forward database management tools. In the environment of the digital representation of solid parts, the disclosed method is conveniently implemented using known computerized computational techniques and database management tools. The method may be implemented in a local environment, or it may be implemented in a network environment, such as by utilizing the Internet to allow designers located at remote sites to access and to use libraries of part models stored in a plurality of data storage devices accessible via the Internet. The method disclosed provides a simple and efficient technique for purging duplicate or near duplicate part models from one or more libraries of such parts. Other types, combinations and ranges of metadata may be used in various embodiments depending upon the requirements of the specific application.

While the preferred embodiments of the present inventions have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A method of comparing parts, the method comprising the steps of:
   compiling a database representing a plurality of parts, each part represented in the database by values representing the volume, surface area, and principal moments of inertia of the part;
   determining values representing the volume, surface area and principal moments of inertia of a subject part;
   identifying a range of values associated with each of the volume, surface area, and principal moments of inertia of the subject part; and
   searching the database to identify all ones of the plurality of parts having values representing volume, surface area, and principal moments of inertia within each of the respective ranges of values.

2. The method of claim 1, further comprising the steps of:
   including in the database, for each of the plurality of parts, values representing the location of the cross-sectional center of gravity with respect to the point of intersection of the principal moments, for each of the planes of the principal moments;
   determining values representing the location of the cross-sectional center of gravity with respect to the point of intersection of the principal moments, for each of the planes of the principal moments for the subject part; and
   comparing the arithmetic sign of the values representing the location of the cross-sectional centers of gravity of the subject part with the equivalent arithmetic sign of the values representing the location of the cross-sectional centers of gravity for each of the plurality of parts.

3. A method of comparing parts, the method comprising the steps of:
   compiling a database representing a plurality of parts, each part represented in the database by values representing the volume, surface area, and the principal moments of inertia of the part;
   determining values representing the volume, surface area and the principal moments of inertia of a subject part;
   searching the database to identify all ones of the plurality of parts having the same representative values for volume, surface area, and principal moments of inertia as the subject part.

4. The method of claim 3, further comprising the steps of:
   including in the database, for each of the plurality of parts, values representing the location of the cross-sectional center of gravity with respect to the point of intersection of the principal moments, for each of the planes of the principal moments;
   determining values representing the location of the cross-sectional center of gravity with respect to the point of intersection of the principal moments, for each of the planes of the principal moments for the subject part; and
   comparing the arithmetic sign of the values representing the location of the cross-sectional centers of gravity of the subject part with the equivalent arithmetic sign of the values representing the location of the cross-sectional centers of gravity for each of the plurality of parts.

5. A method of selecting a part model from among a plurality of part models, each part model representing a modeled part, the method comprising the steps of:
   compiling a database representing a plurality of part models, each part model represented in the database by values representing the volume, surface area, and principal moments of inertia of the respective modeled part;
   determining values for the volume, surface area and principal moments of inertia of a first part;
   identifying a range of values associated with each of the volume, surface area, and principal moments of inertia of the first part;
   searching the database to identify candidate part models from the plurality of part models, each candidate part model having values representing volume, surface area, and principal moments of inertia values within the respective ranges of values; and
   selecting at least one of the candidate part models.

6. The method of claim 5, further comprising the steps of:
   including in the database, for each of the plurality of parts, values representing the location of the cross-sectional center of gravity with respect to the point of intersection of the principal moments, for each of the planes of the principal moments;
   determining values representing the location of the cross-sectional center of gravity with respect to the point of intersection of the principal moments, for each of the planes of the principal moments for the subject part; and
   comparing the arithmetic sign of the values representing the location of the cross-sectional centers of gravity of the subject part with the equivalent arithmetic sign of the values representing the location of the cross-sectional centers of gravity for each of the plurality of parts.

7. A method of identifying redundant part models from among a plurality of part models, each part model representing a modeled part, the method comprising the steps of:

comparing values representing the volume, surface area, and principal moments of inertia of the modeled part for each of the plurality of part models with the corresponding values representing the volume, surface area, and principal moments of inertia of the modeled part of all of the plurality of part models; and identifying ones of the plurality of part models having the same representative values for volume, surface area, and principal moments of inertia as any other one of the plurality of part models.

8. A method of identifying redundant part models from among a plurality of part models, each part model representing a modeled part, the method comprising the steps of:

comparing values representing the volume, surface area, and principal moments of inertia of the modeled part for each of the plurality of part models with the corresponding values representing the volume, surface area, and principal moments of inertia of the modeled part of all of the plurality of part models; and identifying ones of the plurality of part models having representative values for volume, surface area, and principal moments of inertia that are within a predetermined range of the respective representative values for volume, surface area, and principal moments of inertia of any other one of the plurality of part models.

9. A method of comparing parts, the method comprising the steps of:

compiling a database representing a plurality of parts, each part represented uniquely in the database by metadata representing the geometry of the part;

determining corresponding metadata representing the geometry of a subject part; and identifying a range of values associated with the metadata of the subject part; and searching the database to identify all ones of the plurality of parts having metadata within the range of values.

10. The method of claim 9, wherein the metadata comprises values representing the volume, surface area, and the principal moments of inertia of a part.

11. The method of claim 9, wherein the metadata comprises values representing the location of the cross-sectional center of gravity with respect to the point of intersection of the principal moments, for each of the planes of the principal moments.

12. A method of comparing parts, the method comprising the steps of:

compiling a database representing a plurality of parts, each part represented uniquely in the database by metadata representing the part geometry;

determining corresponding metadata representing the geometry of a subject part; and searching the database to identify all ones of the plurality of parts having metadata the same as the metadata of the subject part.

13. The method of claim 12, wherein the metadata comprises values representing the volume, surface area, and the principal moments of inertia of a part.

14. The method of claim 12, wherein the metadata comprises values representing the location of the cross-sectional center of gravity with respect to the point of intersection of the principal moments, for each of the planes of the principal moments.

15. A method of comparing parts that are modeled in heterogeneous environments, the method comprising the steps of:

determining metadata representing the geometry of each of a plurality of parts modeled in a first environment;

determining metadata representing the geometry of each of a plurality of parts modeled in a second environment;

generating a database containing the metadata for each of the plurality of parts modeled in the first and in the second environments;

searching the database to determine if the metadata for any one of the plurality of parts are within a predetermined range of variability of the metadata of any other one of the plurality of parts.

16. The method of claim 15, wherein the step of determining metadata further comprises determining values representing the volume, surface area, and principal moments of inertia of each of the plurality of parts.

* * * * *